United States Patent [19]

Byrkett

[11] Patent Number: 4,996,512
[45] Date of Patent: Feb. 26, 1991

[54] OVERVOLTAGE RESISTOR AND METHOD FOR ITS MANUFACTURE

[75] Inventor: Bruce E. Byrkett, King County, Wash.

[73] Assignee: Seattle Silicon Corporation, Bellevue, Wash.

[21] Appl. No.: 338,080

[22] Filed: Apr. 13, 1989

[51] Int. Cl.⁵ .................... H01C 1/012; H01C 1/02; H01C 7/12

[52] U.S. Cl. .................................. 338/306; 338/333; 338/252; 357/51

[58] Field of Search ............... 338/20, 21, 306, 308, 338/309, 224, 314, 252; 33/301, 258; 357/51, 57; 361/56; 204/192.21

[56] References Cited

U.S. PATENT DOCUMENTS 4,228,451  10/1980  Priel et al. ..................... 338/314 X
4,720,686  1/1988  Westwick ......................... 330/301
4,835,416  5/1989  Miller ............................. 361/56 X

*Primary Examiner*—Bruce A. Reynolds
*Assistant Examiner*—Marvin M. Lateef
*Attorney, Agent, or Firm*—Seed and Berry

[57] ABSTRACT

An overvoltage resistor formed in the substrate semiconductor material of an integrated circuit. The overvoltage resistor is formed from a resistive layer formed over a well of a semiconductor material having a conductivity type which is opposite to the conductivity type of the substrate material. The overvoltage resistor is not connected to the voltage supplies of the integrated circuit, thereby eliminating the virtual pn-diode which would otherwise be formed between the well and the substrate and allowing the overvoltage resistor to protect the integrated circuit from voltages outside the range of supply voltages.

13 Claims, 2 Drawing Sheets

OVERVOLTAGE RESISTOR AND METHOD FOR ITS MANUFACTURE

TECHNICAL FIELD

This invention relates to integrated circuit technology and, more particularly, to a resistance element for use in an integrated circuit containing complementary metal oxide semiconductor circuitry.

BACKGROUND OF THE INVENTION

Integrated circuits are typically designed to communicate signals with external devices through bonding pads on the periphery of the integrated circuit. Circuitry contained on the integrated circuit is designed to operate within predetermined voltage supply levels, which depend upon the process technology used, to produce the integrated circuit. In contrast, external circuitry does not necessarily operate within the same voltage limits as the circuitry on the integrated circuit. This presents a conflict which must be resolved in order for the integrated circuit to be as compatible as possible with external circuitry.

An example of such a situation occurs with an integrated circuit which is designed to receive signals according to the RS422 interface. This interface is defined in "EIA Standard RS422A," *Electronics Industry Association*, Dec. 1978. It is a differential, balanced voltage interface capable of high data rates over long distances. It can accommodate rates of 100 kilobaud over a distance of 4,000 feet, or rates of up to 10 megabaud. This high performance stems from the advantages of a balanced double input signal configuration which is isolated for ground noise currents. Because is it a differential interface, the RS422 interface is also immune to both fluctuating voltage potentials between system ground references and common mode electromagnetic interference.

As a differential interface standard, the RS422 interface will operate correctly as long as an appropriate differential voltage is maintained between the standard two input signal lines, regardless of the absolute voltage levels of those lines. However, due to the common mode voltage changes to which the two input voltages are susceptible, especially over long distances, the voltages on the signal lines according to an RS422 standard may be outside of the voltage range of the integrated circuit. Such voltages have the potential of damaging the chip by triggering "latch-up," as a result of forward-biasing the parasitic diodes at the input pads to the integrated circuit. This latchup phenomenon is described in "Latchup in CMOS Technology," by Ronald R. Troutman, Kluwer Publishers, 1986.

Several techniques may be used to protect the integrated circuit from latch-up damage while allowing it to continue operating. One technique might be to generate higher voltage supplies on the integrated circuit. This can be accomplished by incorporating a charge pump on the circuit. However, the supplies cannot be raised due to drain-to-source breakdown voltages, hot electron effects, and impact ionization problems.

Another approach to protect the integrated circuit is to use circuits that can tolerate signals larger than the supply voltages. This can be accomplished by increasing the thickness of the insulating layer on the MOS field effect transistors (MOSFETs) of the chip. Unfortunately, increasing the thickness of the gate layer decreases the operating speed of the MOSFET's circuitry.

A third technique to protect the integrated circuitry is to scale the signal voltages to be within the limits of the integrated circuits voltage supplies. This can be accomplished by dropping the large input voltages across resistors between the integrated circuits' input pads and the MOSFET circuitry of the chip.

The resistive layers available in digital MOS processes are polysilicon, a conductive "well," an active layer in the substrate, and an active layer in a conductive well. Until the recent introduction of silicide processing, polysilicon was useful as a resistive element. Silicide processing reduces the sheet resistance of polysilicon to improve the speed of the circuitry. Unfortunately, this also limits the use of polysilicon as a resistor because a much longer length of silicided polysilicon is required to produce a given resistance.

A "well" resistor is not usable in standard bulk complementary metal oxide semiconductor (CMOS) technology because the parasitic pn diode between the well and the substrate prevents signal excursions beyond one of the chip's voltage supplies. A resistor made by placing an active layer in the substrate has the same problem as the "well" resistor, as does a resistor made by placing an active layer in a well connected to a supply voltage.

Accordingly, it is desirable to produce a resistive element that can be used on integrated circuits containing CMOS circuitry without limiting the speed of the circuitry, while allowing the input voltages to fall outside of the range of the integrated circuits voltage supplies.

DISCLOSURE OF THE INVENTION

It is an object of the present invention to provide a resistance element for placement in an integrated circuit.

It is another object of the present invention to provide a resistance element for limiting external voltages applied to an integrated circuit.

It is a further object of the present invention to provide a resistance element in an integrated circuit containing CMOS circuitry.

It is another object of the present invention to provide a method for forming a resistance element for placement in an integrated circuit.

These and other objects of the invention are accomplished by a resistance element for use in integrated circuits having one or more supply voltages. The resistance element is formed near the surface of substrate material of a first conductivity type. The resistance element comprises a well and a resistive layer formed in the well. The well is formed in the substrate material and has a conductivity type opposite to the conductivity type of the substrate and is electrically isolated from the supply voltages. The resistive layer is made from a material of the first conductivity type. The resistance element is particularly useful in the case that the integrated circuit includes complementary metal oxide semiconductors.

These and other objects of the invention are also accomplished by a method for forming a resistance element near a surface of a substrate material of a first conductivity type. The method comprises the steps of forming a well in the substrate material and forming a resistive layer in the well. The well is made from a material of a conductivity type opposite to the first conductivity type, and the resistive layer is made from a material of the first conductivity type.

BEST MODES FOR CARRYING OUT THE INVENTION

Figure 1:
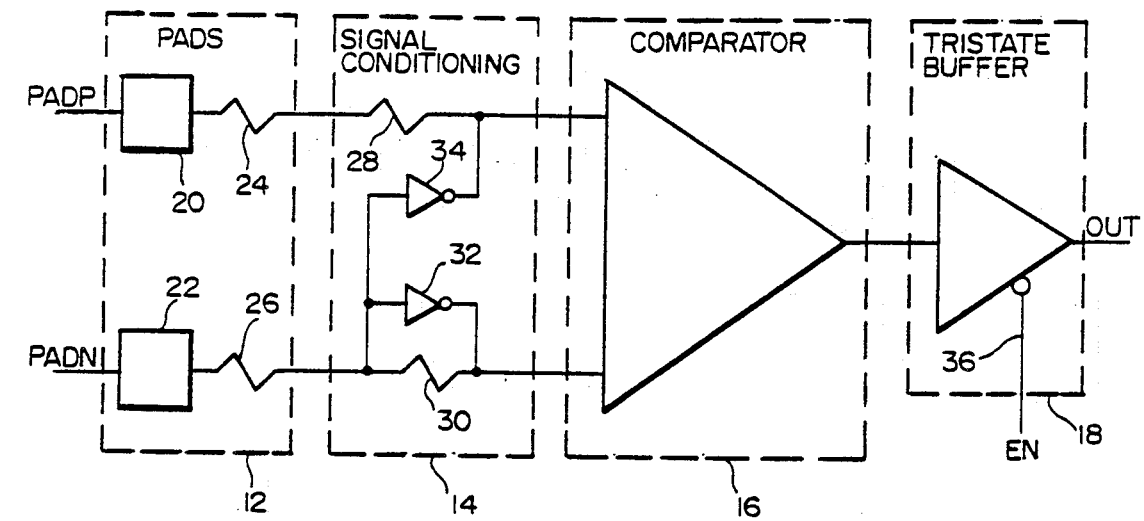
FIG. 1 is an electrical diagram of an RS422 receiver using the resistance elements of the present invention.

Referring to FIG. 1, an RS422 receiver 10, when formed in an integrated circuit, consists of pad module 12, signal conditioning circuit 14, comparator 16, and tristate buffer 18. Operation of the RS422 receiver 10 is dependent upon the voltage difference between signals imposed upon the pads 20 and 22 and pad module 12 and independent of the input signals' absolute voltage levels. The pad module 12 also includes resistors 24 and 26, which are respectively connected to pads 20 and 22.

The signals from the resistors 24 and 26 are transmitted to the signal conditioning circuit 14. Resistor 24 is connected to resistor 28 and resistor 26 is connected to resistor 30, which is in the feedback path of the inverting amplifier 32.

The signals transmitted by the signal conditioning circuit 14 are compared in the comparator 16 and the result of the comparison sent on to a tristate buffer 18 which can be enabled by placing an appropriate enable signal on the input line 36.

Figure 2:
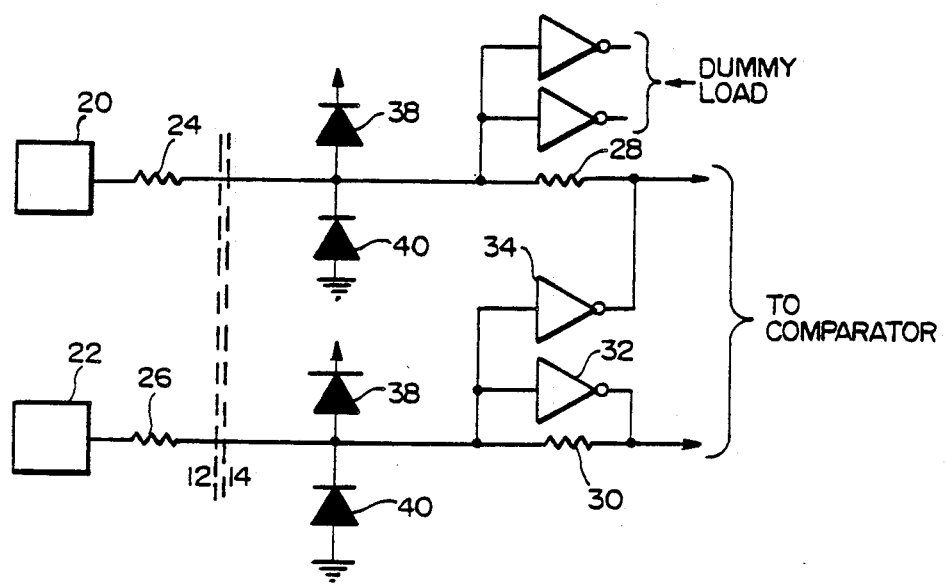
FIG. 2 is an electrical schematic of the pads and signal conditioning of the RS422 receiver shown in FIG. 1.

Referring to FIG. 2, the signal conditioning circuit 14 contains protection diodes 38 and 40. The diodes 38 are connected between a high level supply voltage (such as +5V) and the line carrying the signals transmitted from the pad module 12. The protection diodes 40 are connected between the line carrying the signal from the pad module 12 and a low level supply voltage (such as ground). The protection diodes 38 and 40, therefore, protect the remainder of the circuitry of the RS422 receiver from input voltages which lie outside of the range of voltages defined by the circuit supply (not shown).

Figure 3A:
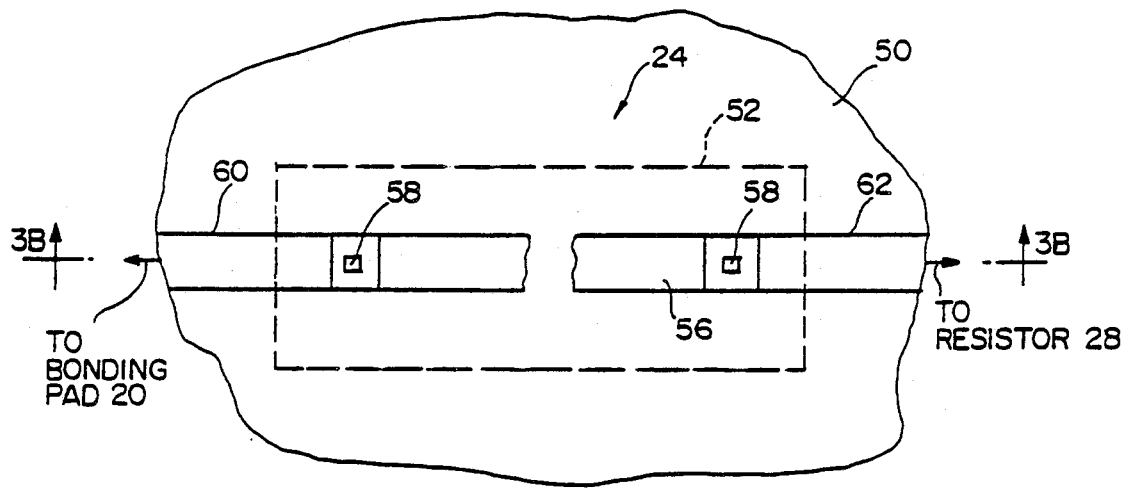
FIG. 3A is a top view of an embodiment of the present invention.
Figure 3B:
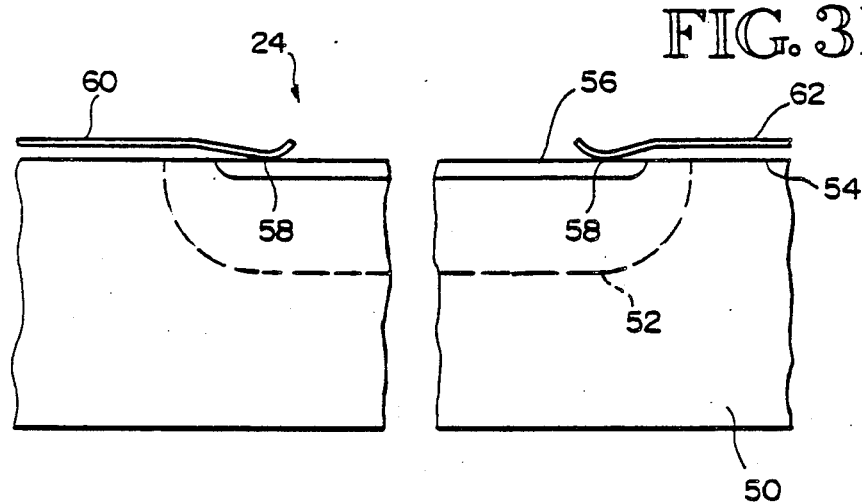
FIG. 3B is a elevational view of the embodiment of the present invention shown in FIG. 3A, when taken along line 3B—3B.

Referring to FIGS. 3A and 3B, the resistor 24 is formed in a substrate 50, which is chosen to have a particular semiconductor conductivity type. For example, the substrate 50 can be p-type semiconductor material. Contained within the substrate 50 is a well 52 which can be formed by implanting a dopant in the substrate 50. The well 52 has an opposite conductivity type from the substrate 50. Therefore, if the substrate 50 is a p-type semiconductor, the well can be made from an n-type semiconductor material to form an "n-well". If the resistor 24 is formed by a 1.5 microns CMOS process technology, the well 52 can extend approximately 3 microns below the surface 54 of the substrate 50, and it can be approximately 4 microns wide on the surface of the substrate 50.

A resistive layer 56, of approximately uniform width, is formed in the well 52 along the surface 54. The resistive layer 56 is formed from a semiconductor material of the same conductivity type as the substrate 50. At each end of the resistive layer 56 a contact pad 58 is formed, to which are attached conductive traces, such as metal traces 60 and 62.

The size of the resistive layer 56 is dependent upon the desired resistance value and the sheet resistivity of the material from which the resistive layer 56 is formed. In the case of a 1.5 micron CMOS process, the layer 56 will be approximately 0.5 micron thick and, when formed from an active diffusion material by conventional photolithography techniques, will have a sheet resistivity of approximately 50 ohms per square.

In the case where the RS422 receiver 10 is formed according to CMOS process technology and the high and low supply voltages are respectively +5 volts and ground, the desired resistance between the bonding pads 20 and 22 and the inputs to the comparator 16 should be approximately 4,000 ohms. In one embodiment of the RS422 receiver 10, the resistors 28 and 30 each have a resistance of approximately 200 ohms, implying that each of the resistors 24 and 26 should have a resistance of approximately 3,800 ohms. If the resistors 24 and 26 are formed from a material having a sheet resistivity of approximately 50 ohms per square, the aspect ratio of the resistive layer 56 should be approximately 76:1 (i.e., 3800/50). Therefore, if the resistive layer 56 is 3 microns wide, it should be approximately 228 microns long. This length can be produced by forming the resistor element into a U- or sinuously-shaped structure on the integrated circuit.

It has been discovered by the inventor that the resistors 24 and 26, described above, perform particularly well if they are electrically isolated from the substrate 50. Under these conditions, the signals on the resistors 24 and 26 can exceed the voltage supplies of the integrated circuit by a large margin, since the breakdown voltage of the pn-diode between the resistive layer 56 and the p-well is 14 volts. This will permit the circuit to operate at 19 volts above ground, i.e., 14 volts above the 5 volt positive supply, since the voltage on the p-well will rise to the value of the 5 volt positive supply before the p-well-to-substrate diode begins to conduct. Similarly, the breakdown voltage of the p-well-to-substrate diode (50 volts) will permit the circuit to operate to 50 volts below the grounded low voltage supply. Under these conditions, the active-to-p-well diode becomes forward-biased, so that the potential of the P-well can fall as far as the P-well-to-substrate breakdown voltage.

Although the resistor element of the present invention has been exemplified by its application to RS422 receiver circuit, those skilled in the art will appreciate that other circuitry which can potentially receive undesirably out-of-range voltages can be protected in the same way. Although the protective action of the resistor of the present invention is particularly suitable to CMOS process technology, it can also be advantageously applied to other MOS technologies, such as nMOS technology.

Those skilled in the art will appreciate that many modifications can be made to the embodiments of the present invention described above without departing from the spirit and scope of the invention. Therefore, the scope of the present invention is to be limited only by the following claims.

I claim:

1. A resistance element for placement in an integrated circuit formed near a surface of a substrate material of a first conductivity type, the integrated circuit being connected to one or more supply voltages, comprising:

a well formed in the substrate material, said well having a conductivity type opposite to the first conductivity type and being electrically isolated from the supply voltages; and a resistive layer made from a material of the first conductivity type and formed in said well.

2. The resistance element of claim 1 wherein said well has a surface substantially aligned with the surface of the substrate material and said resistive layer is formed on said surface of said well.

3. The resistance element of claim 1 wherein said first conductivity type is n-type.

4. The resistance element of claim 1 wherein said first conductivity type is p-type.

5. The resistance element of claim 1 wherein said resistive layer has opposing first and second ends, and further comprising first and second conductive layers formed over the surface of the substrate material and respectively connected to said first and second ends.

6. A resistance element for placement in an integrated circuit formed near a surface of a substrate material of a first conductivity type, the integrated circuit including complementary metal oxide semiconductor circuitry and being connected to one or more supply voltages, comprising a well formed in the substrate material, said well having a conductivity type opposite to the first conductivity type and being electrically isolated from the supply voltages; and a resistive layer made from a material of the first conductivity type and formed in said well.

7. The resistance element of claim 6 wherein said well has a surface substantially aligned with the surface of the substrate material and said resistive layer is formed on said surface of said well.

8. The resistance element of claim 6 wherein said first conductivity type is n-type.

9. The resistance element of claim 6 wherein said first conductivity type is p-type.

10. The resistance element of claim 6 wherein said resistive layer has opposing first and second ends, and further comprising first and second conductive layers formed over the surface of the substrate material and respectively connected to said first and second ends.

11. A method for forming a resistance element near a surface of a substrate material of a first conductivity type, comprising the steps of:

a. forming an electrically-isolated well in the substrate material, said well having a conductivity type opposite to the first conductivity type; and b. forming a resistive layer in said well, said resistive layer being made from a material of the first conductivity type.

12. The method of claim 11 wherein step a further comprises substantially aligning a surface of the well with the surface of the substrate material and step b further comprises forming said resistive layer on said surface of said well.

13. The method of claim 11 wherein step b further comprises forming opposing first and second ends in said resistive layer, the method further comprising the steps of:

c. forming first and second conductive layers over the surface of the substrate material, and d. respectively connecting the first and second conductive layer to said opposing first and second ends.

* * * * *